(12) United States Patent
Katane et al.

(10) Patent No.: US 7,154,089 B2
(45) Date of Patent: Dec. 26, 2006

(54) SCANNING ELECTRON MICROSCOPE

(75) Inventors: Junichi Katane, Naka (JP); Sukehiro Ito, Hitachinaka (JP)

(73) Assignees: Hitachi High-Technologies Corporation, Tokyo (JP); Hitachi Science Systems, Ltd., Ibaraki (JP)

(*) Notice: Subject to any disclaimer, the term of this patent is extended or adjusted under 35 U.S.C. 154(b) by 0 days.

(21) Appl. No.: 11/006,556

(22) Filed: Dec. 8, 2004

(65) Prior Publication Data

US 2005/0127294 A1  Jun. 16, 2005

(30) Foreign Application Priority Data

Dec. 11, 2003 (JP) ............................. 2003-413782

(51) Int. Cl.
*G01N 23/00* (2006.01)
(52) U.S. Cl. ..................................... 250/310
(58) Field of Classification Search ................. 250/311
See application file for complete search history.

(56) References Cited

U.S. PATENT DOCUMENTS 4,897,545 A * 1/1990 Danilatos .................... 250/310

6,512,228 B1 * 1/2003 Todokoro et al. ........... 250/310

FOREIGN PATENT DOCUMENTS

| JP | 6-103951 | 4/1994 |
| JP | 9-147782 | 8/1997 |

* cited by examiner

*Primary Examiner*—David A. Vanore
(74) *Attorney, Agent, or Firm*—McDermott Will & Emery LLP

(57) ABSTRACT

A scanning electron microscope in which the secondary electrons generated from a specimen are efficiently caught by a secondary electron detector by correcting and controlling the trajectory of the secondary electrons is disclosed. A first auxiliary electrode impressed with a negative potential of several to several tens of volts is arranged in the vicinity of a radiation hole of the primary electron beam under an objective lens, and a second auxiliary electrode impressed with a positive voltage is arranged on the side of the first auxiliary electrode nearer to the secondary electron detector thereby to correct and control the trajectory of the secondary electrons. Further, a third auxiliary electrode for assisting in catching the secondary electrons generated from the specimen is arranged on the front surface of the secondary electron detector.

7 Claims, 6 Drawing Sheets

(APPLIED ELECTRON BEAM : 10,000 eV)

FIG.7
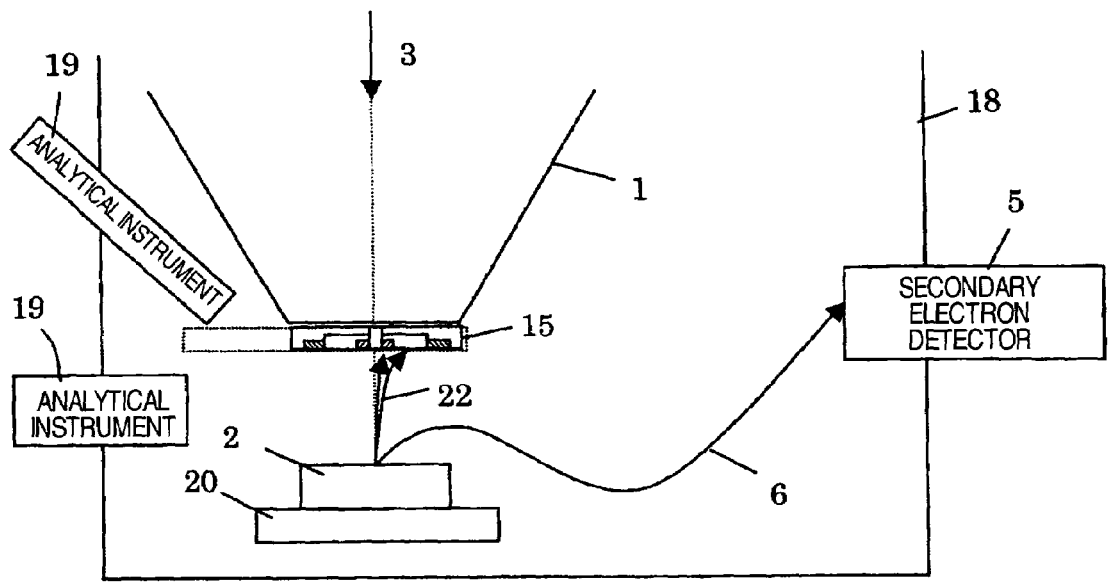
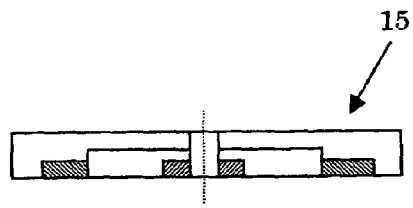
FIG.8A
FIG.8B
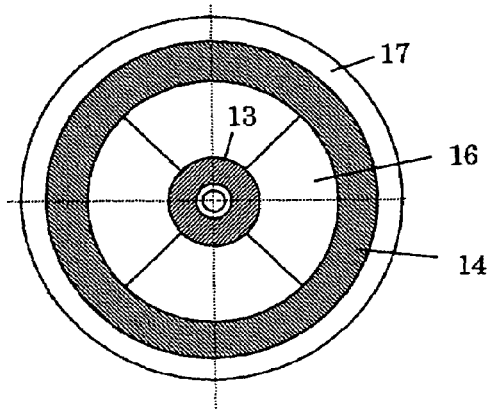

SCANNING ELECTRON MICROSCOPE

BACKGROUND OF THE INVENTION

The present invention relates to a scanning electron microscope, or in particular to a configuration and the control operation of a secondary electron detection system thereof.

The scanning electron microscope is a device in which the primary electron beam is radiated by scanning on a specimen and the secondary electrons generated from the specimen are detected by a secondary electron detector in synchronism with the scanning thereby to form a specimen image. Normally, secondary electrons having a very small energy on the order of several eV to several tens of eV are generated from the specimen irradiated with the primary electron beam, and applied to the secondary electron detector under the guidance of a transverse positive field of about 10 kV impressed from the secondary electron detector. In addition to this basic process, the scanning electron microscope recently developed further comprises a biased electrode impressed with a positive voltage of several hundred volts in the vicinity of the specimen to increase the yield by correcting the trajectory of the secondary electrons toward the detector. The biased electrode, tabular or net-shaped, is called the "secondary electron collector electrode" or the "auxiliary electrode" and is intended to increase the yield of the secondary electrons by changing the shape or the applied voltage to the optimum value. Various electrodes of this type intended to increase the yield of the secondary electrons by use of the positive field have been proposed, and it has been common practice to "correct the trajectory of the secondary electrons of negative potential by the positive field" (JP-A-6-103951, etc.). JP-A-9-147782, on the other hand, describes a method in which an annular electrode (U-shaped open to the side far from the secondary electron detector) impressed with a negative voltage of –100 to –500 V is arranged above a specimen to guide the secondary electrons toward the detector.

The secondary electrons generated from the specimen by the radiation of the primary electron beam thereon are emitted in various directions normally within the range of 0 to 90 degrees in vertical direction and 0 to 360 degrees in horizontal direction. In JP-A-9-147782, a U-shaped negative voltage application electrode open toward the secondary electron detector is arranged to guide the secondary electrons having various directivities toward the secondary electron detector. Analysis by simulation of the secondary electron trajectory has revealed, however, that the secondary electrons are not only absorbed by bombardment into the lower part or the substructure of a magnetic objective lens but also bombard the specimen stage and the various detectors (ground potential) arranged in the neighborhood of the magnetic objective lens, with the result that only a small part of the secondary electrons generated can reach the secondary electron detector. This trend is especially conspicuous in the case where the high-resolution observation is tried, i.e. the magnetic objective lens is close to the specimen, in which case an image of low quality results.

SUMMARY OF THE INVENTION

The object of this invention is to provide a scanning electron microscope in which the efficiency of the secondary electron detector detecting the secondary electrons emitted from the specimen is improved by positively correcting the trajectory of the secondary electrons (especially, those passing the neighborhood of the ray axis).

According to this invention, the trajectory of the secondary electrons emitted from the specimen in the direction close to the ray axis is corrected positively toward the secondary electron detector, while at the same time guiding the secondary electrons to the secondary electron detector along a bypass trajectory avoiding the parts of ground potential. For this purpose, a first auxiliary electrode is arranged in the vicinity of the primary electron beam radiation port in the lower part (lower magnetic pole) of the magnetic objective lens or the structure underlying the magnetic objective lens. In this way, a negative potential of 1 V to 30 V is applied to strengthen the transverse potential so that the trajectory of the secondary electrons generated from the specimen is corrected toward the secondary electron detector as far as possible.

Specifically, according to the invention, there is provided a scanning electron microscope comprising a specimen stage for holding a specimen, a magnetic objective lens for radiating a converged primary electron beam on the specimen and a secondary electron detector for detecting the secondary electrons generated from the specimen by radiation of the electron beam, wherein a first auxiliary electrode of negative potential is arranged in the vicinity of the primary electron radiation port in the lower part of the magnetic objective lens. The first auxiliary electrode forms a transverse field toward the outer periphery, whereby the trajectory of the secondary electrons generated from the specimen are deflected toward the outer periphery thereby to increase the secondary electrons entering the secondary electron detector arranged transversely.

Preferably, a second auxiliary electrode of positive potential is arranged at least on the side of the first auxiliary electrode nearer to the secondary electron detector. The secondary electrons pushed back toward the specimen by the negative electric field of the first auxiliary electrode are deflected toward the secondary electron detector thereby to increase the secondary electrons entering the secondary electron detector arranged transversely.

The first auxiliary electrode is annular or in the shape of U open toward the secondary electron detector. The second auxiliary electrode, on the other hand, may be annular with a larger diameter than the first auxiliary electrode or in the shape of U closed on the side toward the secondary electron detector. Preferably, the potential of the first auxiliary electrode is in the range of about –5 V to –20 V, and the potential of the second auxiliary electrode in the range of about +5 V to +20 V.

More preferably, a third auxiliary electrode of positive potential is arranged between the secondary electron detector and the specimen. Specifically, the secondary electron detector is configured of a scintillator (electron-photo converter) with a positive potential of about 10 kV applied to the surface thereof and a photomultiplier for detecting the converted light, and the tabular third auxiliary electrode is arranged between the scintillator surface electrode and the specimen thereby to apply a positive potential. As a result, the trajectory of the secondary electrons is deflected and guided toward the scintillator so that the secondary electrons entering the secondary electron detector can be increased.

According to another aspect of the invention, there is provided a scanning electron microscope comprising a specimen stage for holding a specimen, a magnetic objective lens for radiating a converged primary electron beam on the specimen, a secondary electron detector for detecting the secondary electrons generated from the specimen irradiated with the electron beam and an annular back-scattered electron detector having a primary electron beam pass hole in the lower part of the magnetic objective lens, wherein the back-scattered electron detector includes a first auxiliary electrode of negative potential in the vicinity of the primary electron pass hole and a secondary auxiliary electrode of positive potential on the outer periphery thereof. The potential of the first auxiliary electrode is preferably −5 V to −20 V, and the potential of the second auxiliary electrode about +5 V to +20 V.

According to this invention, the secondary electrons generated from the specimen can be applied efficiently to the secondary electron detector and an image of high quality can be produced.

Other objects, features and advantages of the invention will become apparent from the following description of the embodiments of the invention taken in conjunction with the accompanying drawings.

BRIEF DESCRIPTION OF THE DRAWINGS

FIG. 7 is a diagram showing another example of configuration of the scanning electron microscope according to the invention.

FIGS. 8A and 8B are diagrams showing an example of structure of a semiconductor back-scattered electron detector according to the invention.

DETAILED DESCRIPTION OF THE INVENTION

Figure 1:
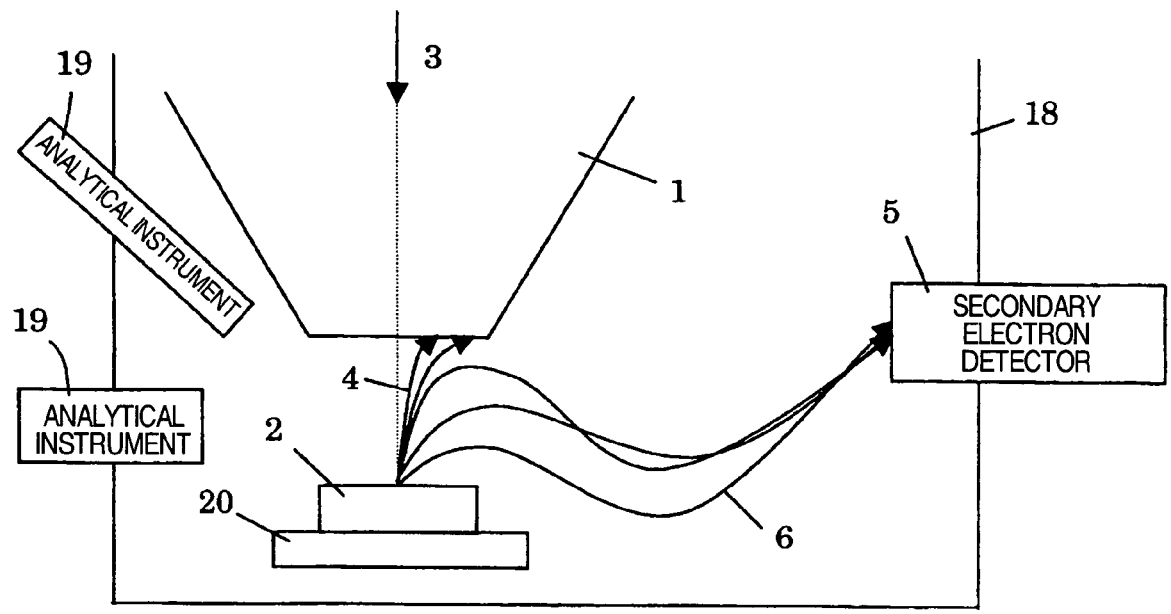
FIG. 1 is a diagram showing a configuration of an ordinary scanning electron microscope.

An embodiment of the invention is explained below with reference to the drawings. To facilitate the understanding, the same component parts are designated by the same reference numerals, respectively, in the drawings.

FIG. 1 is a schematic diagram for explaining the trajectory of the secondary electrons generated from a specimen by radiation of the primary electron beam in a usual scanning electron microscope. The specimen 2 is held on a specimen stage 20 in a vacuum specimen chamber 18. In the case where the primary electron beam 3 radiated from the lower surface of the magnetic objective lens 1 is scanned on the surface of the specimen 2, the secondary electrons 4, 6 carrying the information on the specimen 2 are generated. The secondary electrons 4 are emitted at a small angle to the ray axis, while the secondary electrons 6 are emitted at a large angle to the ray axis. The secondary electrons are applied to a secondary electron detector (forming a positive electric field of about 10 kV in the neighborhood of a scintillator) 5 mounted in a predetermined direction thereby to form a specimen image. Some component parts, however, constitute a stumbling block (ground potential) changing the trajectory of the secondary electrons before reaching the secondary electron detector 5 and deteriorate the efficiency of detection of the secondary electrons. This is caused by the fact that while the secondary electrons of negative potential can be pulled in at a positive potential by the secondary electron detector or the like, the ground potential for pulling in the secondary electrons, if any is existent in the neighborhood of the trajectory, forcibly curves the equipotential plane of positive potential and thus changes the trajectory of the secondary electrons. The component parts of the ground potential causing the deterioration of the detection efficiency of the secondary electrons include analytical instruments 19 such as EDX, WDX and EBSP, a specimen inching stage 20 and the lower surface of the magnetic objective lens 1 in opposed relation to the specimen 2.

Figure 2:
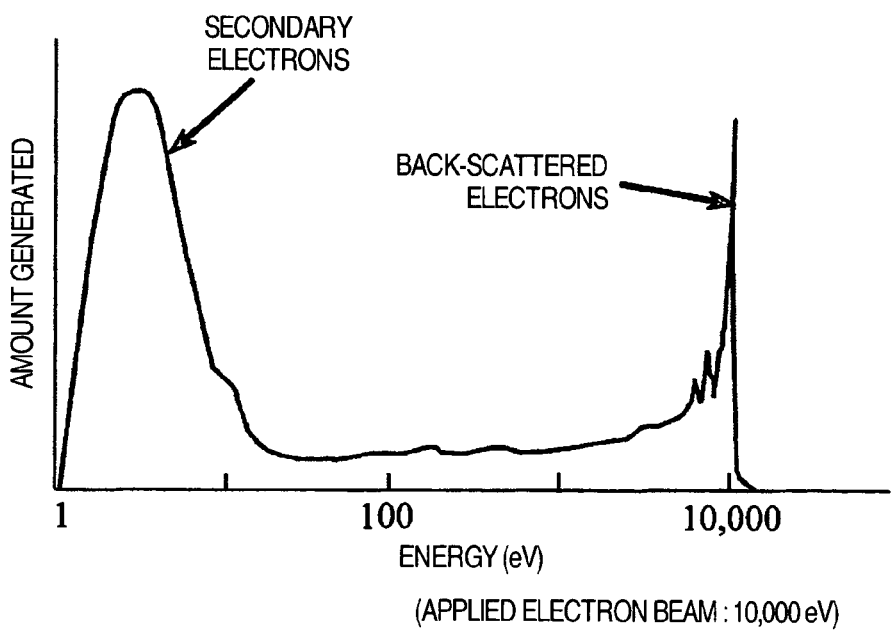
FIG. 2 shows an energy distribution of the secondary electrons generated from the specimen.
Figure 3A:
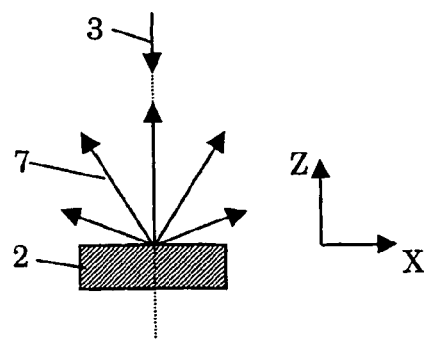
FIGS. 3A and 3B show the directions in which the secondary electrons are generated from the specimen.
Figure 3B:
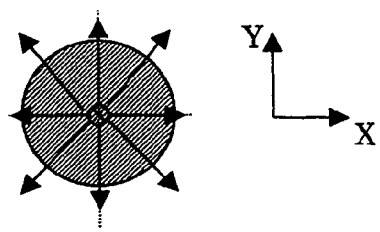

FIG. 2 shows the energy distribution of the secondary electrons in an ordinary scanning electron microscope, and FIGS. 3A and 3B the directions in which the secondary electrons are generated from the specimen. As shown in FIG. 2, the secondary electrons generated from the specimen have the energy of about several eV to several tens of eV. The back-scattered electrons have substantially the same energy as the primary electron beam. Normally, the secondary electrons 7 of several eV to several tens of eV are emitted in various directions at ±90 degrees in the directions perpendicular to the ray axis as shown in FIG. 3A and at 360 degrees in the directions parallel to the ray axis as shown in FIG. 3B.

Figure 4A:
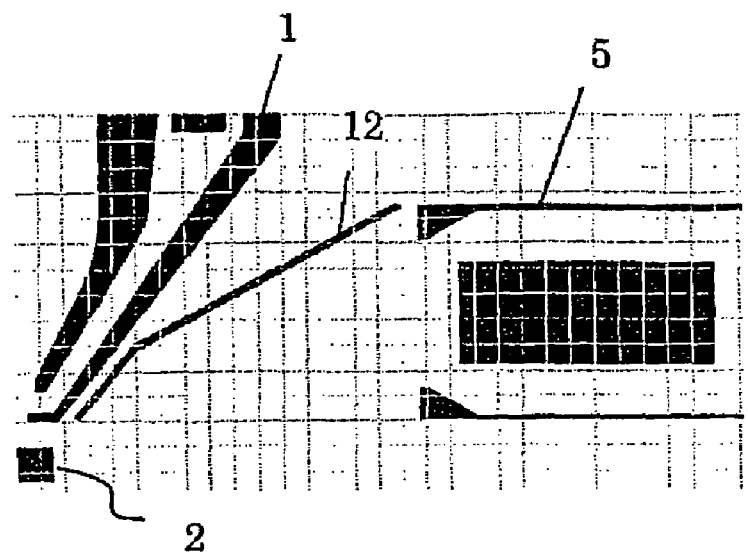
FIGS. 4A and 4B show the position of the secondary electron detector and the trajectory of the secondary electrons in an ordinary scanning electron microscope.
Figure 4B:
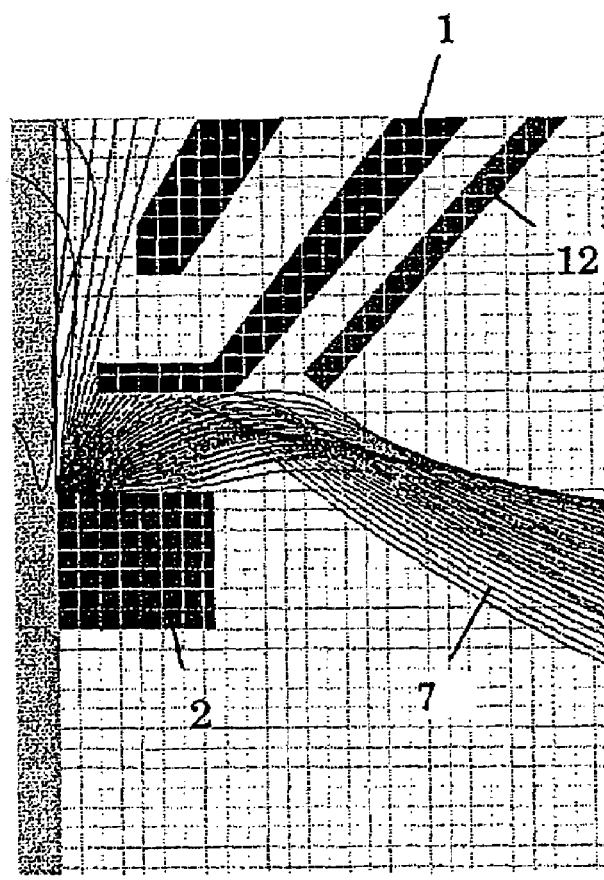

FIGS. 4A and 4B show simulated trajectories of the secondary electrons. FIG. 4A shows a layout of the magnetic objective lens 1, the specimen 2 and the secondary electron detector 5 used essentially for simulation. A biased electrode 12 impressed with a positive voltage of 300 V is interposed between the specimen 2 and the secondary electron detector 5. The secondary electron detector 5 is impressed with a positive voltage of 10 kV to pull in the secondary electrons. FIG. 4B shows the result of simulating the trajectories of the secondary electrons on the assumption that the secondary electrons of about several eV to several tens of eV are generated from the specimen in the directions shown in FIGS. 3A and 3B.

FIG. 4B indicates that, of all the secondary electrons having the energy range of several eV to several tens of eV generated from the specimen, those having a comparatively low energy of about several eV are pulled in to some degree by the positive field generated by the secondary electron detector, while the secondary electrons having a comparatively high energy of about several tens of eV bombard the magnetic objective lens or remain free of the effect of the pull-in field generated by the secondary electron detector, thereby deteriorating the detection efficiency. Further, the secondary electrons in the neighborhood of the ray axis are visually understood to be hardly pulled in toward the secondary electron detector. The invention is intended to study and obviate this problem.

Figure 5:
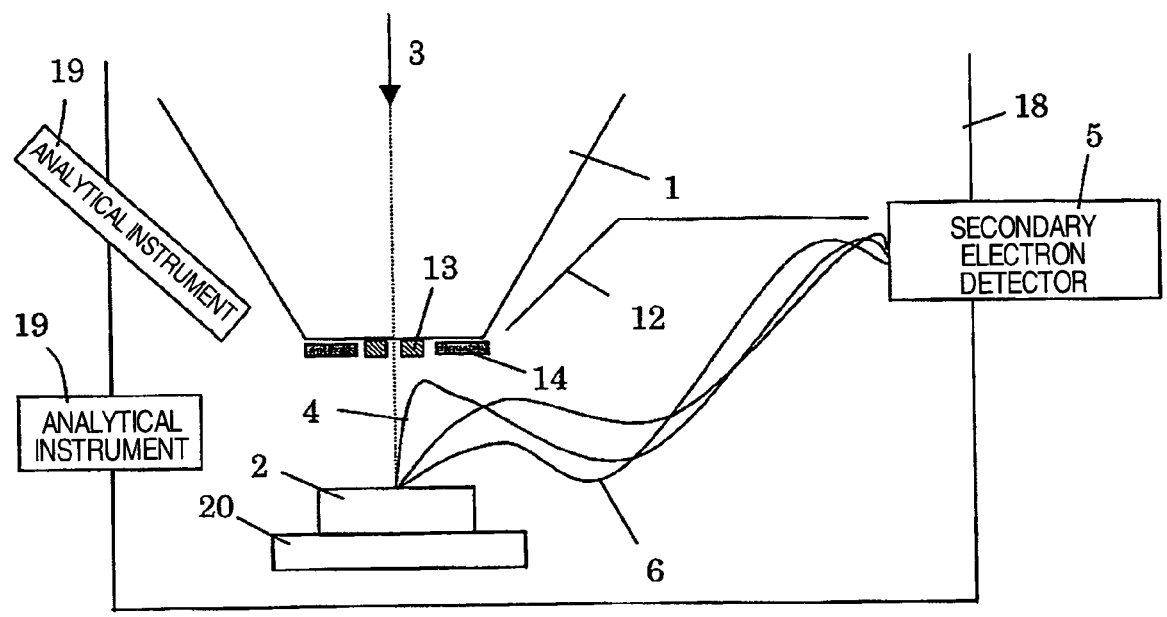
FIG. 5 is a diagram showing an example of configuration of the scanning electron microscope according to this invention.

FIG. 5 is a diagram schematically showing a scanning electron microscope according to the invention. The primary electron beam 3 radiated from the lower surface of the magnetic objective lens 1 is scanned on the surface of the specimen 2. Then, the secondary electrons 4, 6 carrying the specimen information are generated. The secondary electrons 4, 6 are applied to a secondary electron detector (forming a positive field of about 10 kV in the neighborhood of the scintillator) thereby to form an image. According to this invention, a first auxiliary electrode 13 is arranged in proximity to the radiation port of the primary electron beam 3 in the structure under the magnetic objective lens 1 in order to positively correct the trajectory of the secondary electrons 4 emitted in the direction near the ray axis. Preferably, the first auxiliary electrode 13 has an annular configuration surrounding the ray axis or the shape of U open toward the secondary electron detector 5. The first auxiliary electrode 13 is impressed with a negative voltage of minus several volts to minus several tens of volts (about −5 V to −20 V) to correct the trajectory in such a manner as to prevent the secondary electrons from bombarding an object of the ground potential such as the lower magnetic pole of the magnetic objective lens.

The annular configuration or the U shape open toward the secondary electron detector is recommended by reason of the fact that as shown in FIG. 3, the secondary electrons are generated from the specimen in all the directions. In the case where the first auxiliary electrode 13 is U-shaped, the open end of the letter U is directed toward the secondary electron detector. Then, the secondary electrons emitted in all the directions come to have a directivity more effectively than the annular configuration. As far as the voltage applied to the first auxiliary electrode 13 is concerned, a negative voltage higher than the energy of the secondary electrons of negative potential would suppress the generation of the secondary electrons from the specimen. As understood from the energy distribution of the secondary electrons shown in FIG. 2, the energy range of the secondary electrons is about 5 eV to 20 eV, and therefore a negative voltage higher than this range is not required. In the ordinary scanning electron microscope, the distance between the specimen and the lower surface of the magnetic objective lens (working distance) can be changed arbitrarily, and therefore the negative voltage applied to the first auxiliary electrode 13 is rendered changeable in the range of about −5 V to −20 V to make sure that the same negative field is applied to the secondary electrons even after changing the working distance.

More preferably, a second auxiliary electrode 14 is arranged on the side of the first auxiliary electrode 13 nearer to the secondary electron detector to make it possible to apply a positive voltage of several volts (about +5 V to +20 V). This second auxiliary electrode 14 plays the role of pulling up the trajectory of the secondary electrons that has been pushed back toward the specimen in the first auxiliary electrode 13 and thereby guiding the secondary electrons toward the secondary electron detector as far as possible. The second auxiliary electrode 14, like the first auxiliary electrode, may be annular or have the shape of U. In the case where the second auxiliary electrode 14 is U shaped, the closed side of the letter U is directed toward the secondary electron detector.

The positive potential of several volts (about +5 V to +20 V) is applied to the second auxiliary electrode 14 is by reason of the fact that the voltage applied by the first auxiliary electrode 13 is minus several volts (about −5 V to −20 V), and a reverse bias larger than the applied voltage due to the first auxiliary electrode 13 is not required to be applied by the second auxiliary electrode 14. In the case where a negative voltage of −Va volts is applied to the first auxiliary electrode 13 and a positive voltage of +Vb (Vb>Va) to the second auxiliary electrode 14, for example, the secondary electrons are affected so strongly by the electric field due to the second auxiliary electrode 14 as to be pulled into (bombard) the second auxiliary electrode 14 with the result that the secondary electrons cannot be pulled in toward the secondary electron detector 5. In the ordinary scanning electron microscope, on the other hand, the working distance can be arbitrarily changed, and therefore, like in the first auxiliary electrode 13, the voltage applied to the second auxiliary electrode is rendered changeable arbitrarily in the range of about +5 V to +20 V to make sure that the second auxiliary electrode applies always the same positive electric field to the secondary electrons.

In order to guide the secondary electrons, of which the trajectory has been corrected by the first auxiliary electrode 13 and the second auxiliary electrode 14, to the secondary electron detector 5, a third auxiliary electrode insulated from the electrode of the secondary electron detector 5 is arranged on the front surface of the electrode of the secondary electron detector 5 in the direction toward the specimen, and a positive potential of several tens to several hundreds of volts is applied. The third auxiliary electrode has the same configuration as the biased electrode included in the conventional scanning electron microscope. In the conventional scanning electron microscope, for lack of other than the third auxiliary electrode, the efficiency of detecting the secondary electrons cannot be improved conspicuously. According to this invention, in contrast, the first auxiliary electrode, the second auxiliary electrode and the third auxiliary electrode combine to improve the efficiency of detecting the secondary electrons.

The provision of the third auxiliary electrode 12 makes it possible to correct the trajectory of the secondary electrons emitted into the space between the lower portion of the magnetic objective lens 1 and the secondary electron detector 5. The third auxiliary electrode 12 has the function of guiding the secondary electrons toward the secondary electron detector 5 by avoiding the specimen stage, the specimen inching stage 20 near the specimen stage and the stumbling blocks (ground potential) in the neighborhood of the lower magnetic pole of the magnetic objective lens such as the detectors 19 (EDX, WDX and EBSP) placed near the specimen. Like in the first auxiliary electrode 13 and the second auxiliary electrode 14, the voltage applied to the third auxiliary electrode is rendered arbitrarily changeable to secure always the same electric field applied to the secondary electrons even in the case where the working distance is changed.

Figure 6:
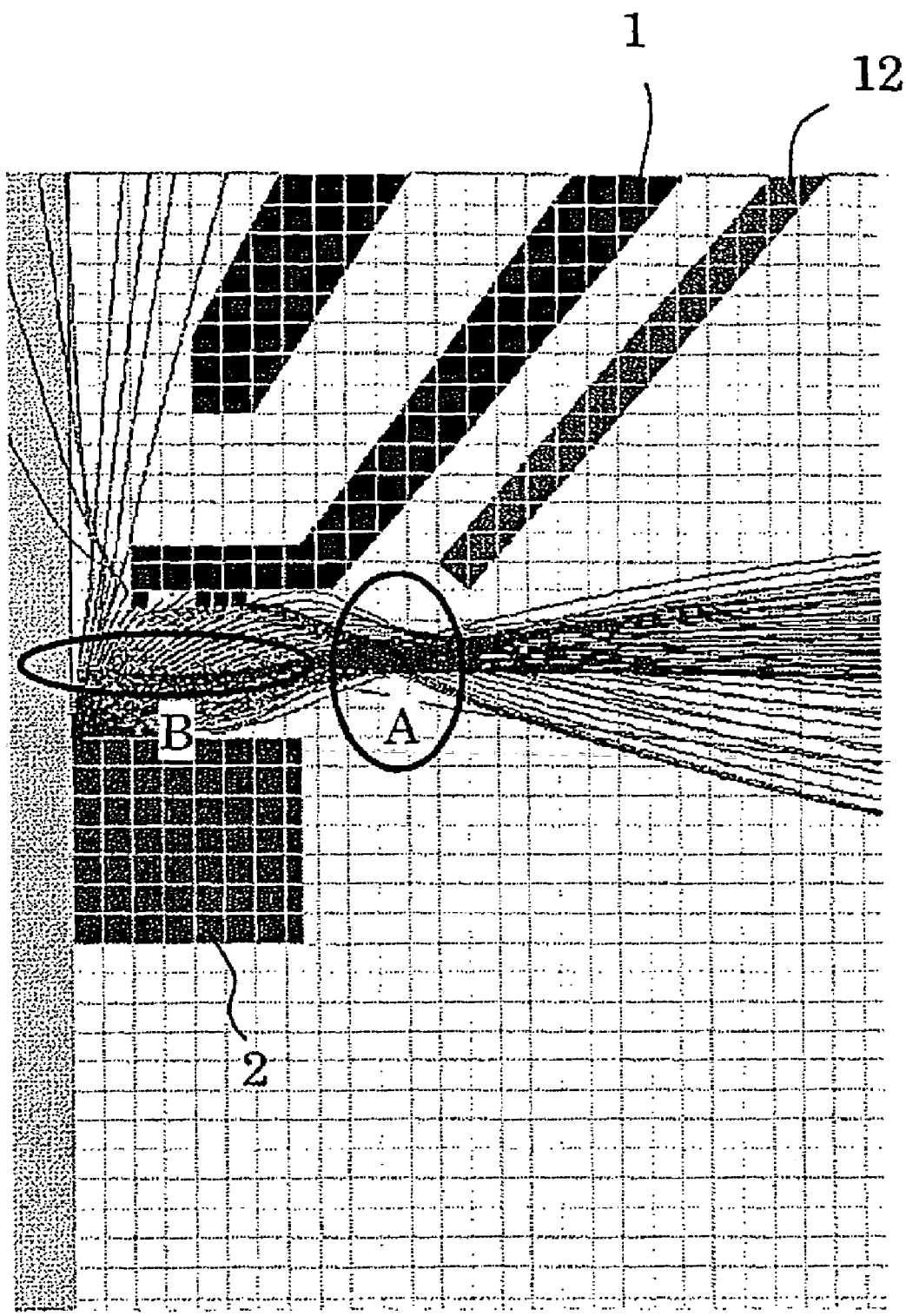
FIG. 6 is a diagram showing the difference of the secondary electron trajectory between the scanning electron microscope according to the invention and the ordinary scanning electron microscope.

FIG. 6 is a diagram showing the result of simulation of the trajectory of the secondary electrons in the presence of the first auxiliary electrode 13, the second auxiliary electrode 14 and the third auxiliary electrode 12. Comparison between FIGS. 4B and 6 shows that the trajectories of the secondary electrons are increased in a portion A surrounded by a circle in FIG. 6. Taking note of a portion B surrounded by a circle in FIG. 6, on the other hand, it is understood that according to this invention, the secondary electrons are guided toward the secondary electron detector without bombarding the lower surface of the magnetic objective lens 1. The provision of both the first auxiliary electrode 13 and the second auxiliary electrode 14 is more effective than the provision of the first auxiliary electrode 13 alone. The effect is increased even more by arranging the first auxiliary electrode 13, the second auxiliary electrode 14 and the third auxiliary electrode 12 at the same time.

According to this invention, the secondary electrons are led toward the secondary electron detector not simply by use of the positive field but the yield of the secondary electrons is increased by appropriately controlling the repulsive force between the secondary electrons having a negative potential and the electrodes impressed with a negative potential and the attractive force of the positive field. As a result, the yield of the secondary electrons can be increased than in the prior art, and the observation becomes possible with the radiated primary electron beam reduced as far as possible. By improving the efficiency of detecting the secondary electrons, the observation becomes possible while the lenses are set to the conditions of higher resolution, thereby contributing to an improved resolution for observation and an improved image quality.

FIG. 7 is a schematic diagram showing a configuration of a scanning electron microscope using a semiconductor back-scattered electron detector. The primary electron beam 3 emitted from the lower surface of the magnetic objective lens is scanned on the surface of the specimen, and then the back-scattered electrons 22 carrying the information on the specimen composition are generated together with the secondary electrons 6. As shown in FIG. 2, the back-scattered electrons have an energy higher than the secondary electrons and equivalent to the energy of the primary electron beam. The semiconductor back-scattered electron detector 15 is arranged immediately below the lower magnetic pole of the magnetic objective lens as a detector intended to observe the back-scattered electrons. The problem is that the semiconductor back-scattered electron detector 15 is also at the ground potential and has an adverse effect on the trajectory of the secondary electrons. With regard to some specimen, the user may want to observe the image of the secondary electrons using the secondary electron detector 5 at the same time as the back-scattered electrons (while installing the back-scattered electron detector) in the semiconductor back-scattered electron detector 15. In such a case, unless some protective measure is taken, the trajectory of the secondary electrons would be adversely affected by the ground potential of the semiconductor back-scattered electron detector 15 resulting in a deteriorated efficiency of detecting the secondary electrons. In view of this, according to this invention, the first auxiliary electrode 13 or both the first auxiliary electrode 13 and the second auxiliary electrode 14 are built in the semiconductor back-scattered electron detector 15.

FIGS. 8A and 8B are diagrams showing an example of structure of a semiconductor back-scattered electron detector according to the invention. FIG. 8A is a sectional view, and FIG. 8B a bottom view. The semiconductor back-scattered electron detector 15 is formed with a 4-segment semiconductor detection element 16 on a semiconductor detection element base 17, and has a hole for passing the primary electron beam at the center thereof. According to the invention, a conductor or an electrode capable of generating an electric field is built in the semiconductor element portion of the semiconductor back-scattered electron detector 15 in advance. Also, a first auxiliary electrode 13 to be is built in at the inner diametrical portion and a second auxiliary electrode 14 to be at the outer diametrical portion. The use of the semiconductor back-scattered electron detector 15 of this structure makes it possible to apply the back-scattered electrons to the semiconductor back-scattered electron detector at the same time without adversely affecting the yield of the secondary electrons for the secondary electron detector 5. Thus, the above-mentioned problem posed in observing the secondary electrons and the back-scattered electrons at the same time is resolved. The back-scattered electrons have substantially the same energy as the primary electron beam applied to the specimen. Since the normal accelerated voltage is in the range of 0.5 kV to 30 kV, the first auxiliary electrode 13 of negative potential has substantially no effect on the detection of the back-scattered electrons.

Figure 9:
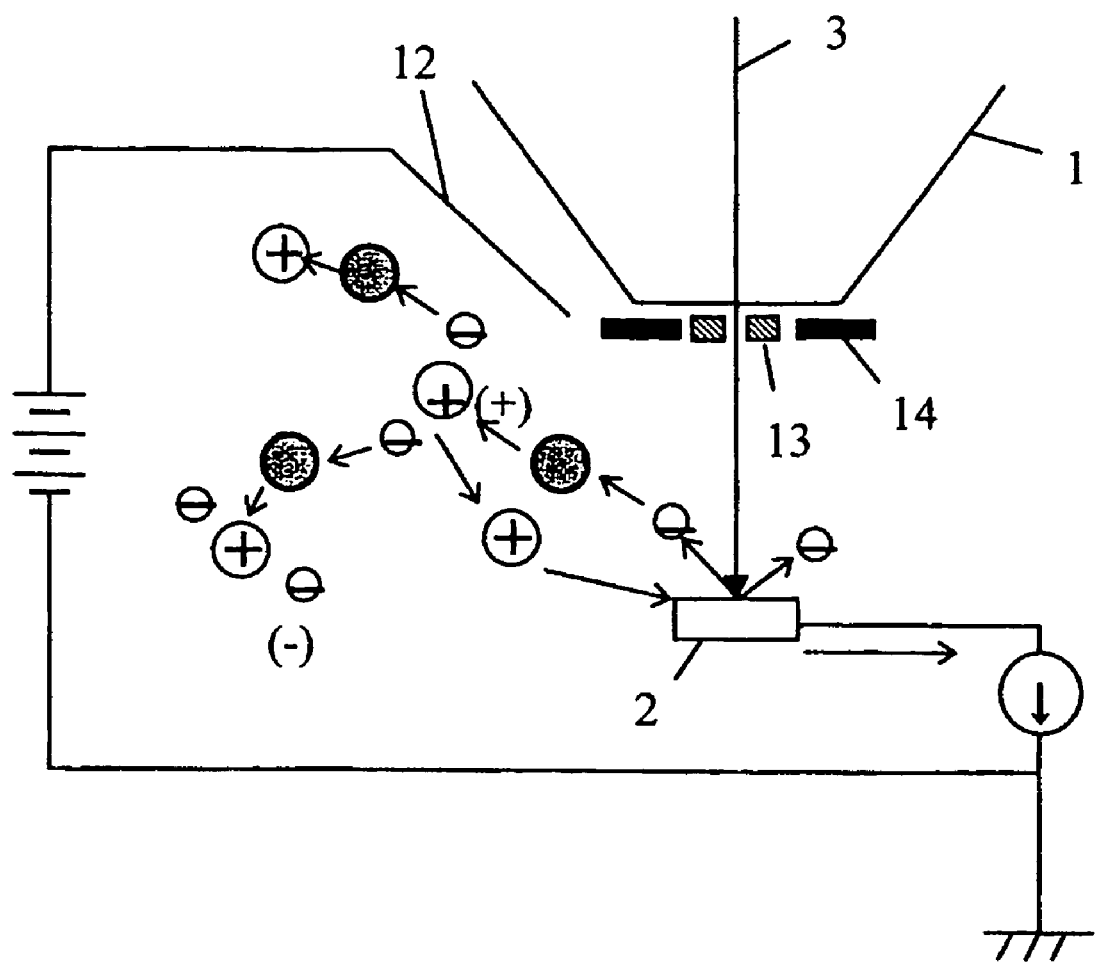
FIG. 9 is a diagram showing an example of application of the scanning electron microscope according to the invention to the detection of the secondary electrons in low vacuum.

FIG. 9 is a diagram showing an example of application of the scanning electron microscope according to the invention to the detection of the secondary electrons in low vacuum. The secondary electrons in low vacuum are detected by a mechanism (gas amplification type detection method) in which the internal vacuum degree of the specimen chamber is reduced to as low as 1 to about 3000 Pa, and the secondary electrons emitted from the specimen (it is usually difficult to observe the secondary electrons in a low vacuum environment) are pulled up in a positive field and accelerated so that the bombardment like the cascade amplification with the residual gas molecules is repeated. In this way, the positive ions carrying the information on the secondary electrons are amplified. After that, the positive ions are applied to the amplifier as a specimen current from the specimen thereby to form an image of the secondary electrons in low vacuum.

In the scanning electron microscope according to the invention, the positive voltage used for detecting the secondary electrons in low vacuum can be applied from the first auxiliary electrode 13 and the second auxiliary electrode 14. Specifically, both the first auxiliary electrode 13 and the second auxiliary electrode 14 are increased to positive potential by controlling the applied voltages thereof. Thus, the first auxiliary electrode 13 and the second auxiliary electrode 14 can be used also as the electrodes for applying an electric field in the gas amplification type detection method in which while the pressure in the specimen chamber is held at 1 Pa or higher, the electron beam is applied to the specimen and the ions generated are detected to form an image. In this case, these auxiliary electrodes can be conveniently controlled to a negative or positive voltage in accordance with the vacuum state of the specimen chamber. The provision of a semiconductor back-scattered electron detector including the first auxiliary electrode 13 and the second auxiliary electrode 14 makes it possible to observe a composition image, a stereoscopic image, etc. of the back-scattered electrons in the semiconductor back-scattered electron detector on the one hand and a gas amplification secondary electron image at the same time.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope comprising:
   a specimen stage for holding a specimen,
   an objective lens for radiating a converged primary electron beam on the specimen,
   a secondary electron detector for detecting the secondary electrons generated from the specimen by the radiation of the electron beam thereon,
   a first electrode, arranged under the objective lens, to which negative voltage is applied to form electric field for repelling the secondary electrons emitted from said specimen on a side of the specimen; and
   a second electrode, arranged between said first electrode and said secondary electron detector and on an outer peripheral side of said first electrode in relation to a primary electron beam radiation port of said objective lens, to which positive voltage is applied to form electric field for attracting the secondary electrons repelled by said first electrode;
   wherein said secondary electron detector is arranged on an outer peripheral side of said second electrode in relation to said primary electron beam radiation port and on a trajectory of said secondary electrons repelled by said first electrode and attracted by said second electrode.

2. A scanning electron microscope according to claim 1, wherein:
the first electrode has a selected one of an annular configuration and a U-shaped configuration open toward the secondary electron detector, and
the second electrode has a selected one of an annular configuration having a larger diameter than the first electrode and a U-shaped configuration with a closed side nearer to the secondary electron detector.

3. A scanning electron microscope according to claim 1, wherein the potential of the first electrode is −5 V to −20 V, and the potential of the second electrode is +5 V to +20 V.

4. A scanning electron microscope according to claim 1, wherein a third electrode of positive potential is interposed between the secondary electron detector and the specimen.

5. A scanning electron microscope according to claim 1, wherein the potential of each of the first and second electrodes is applicable as a positive potential.

6. A scanning electron microscope comprising:
a specimen stage for holding a specimen,
an objective lens for radiating a converged primary electron beam on the specimen,
a secondary electron detector for detecting the secondary electrons generated from the specimen by the radiation of the electron beam thereon,
a first electrode, arranged under the objective lens, to which negative voltage is applied to form electric field for repelling the secondary electrons emitted from said specimen on a side of the specimen;
a second electrode, arranged between said first electrode and said secondary electron detector and on an outer peripheral side of said first electrode in relation to a primary electron beam radiation port of said objective lens, to which positive voltage is applied to form electric field for attracting the secondary electrons repelled by said first electrode, wherein the secondary electron detector is arranged on an outer peripheral side of said second electrode in relation to the primary electron beam radiation port of said objective lens; and
a backscattered electron detector of which a detecting surface is arranged between said first electrode and said second electrode.

7. A scanning electron microscope according to claim 6, wherein the potential of the first electrode is −5 V to −20 V, and the potential of the second electrode is +5 V to +20 V.

* * * * *